(12) United States Patent
Kaviani

(10) Patent No.: US 6,212,670 B1
(45) Date of Patent: *Apr. 3, 2001

(54) METHOD FOR IMPLEMENTING A PROGRAMMABLE LOGIC DEVICE HAVING LOOK-UP TABLE AND PRODUCT-TERM CIRCUITRY

(75) Inventor: Alireza S. Kaviani, Toronto (CA)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,891

(22) Filed: Sep. 1, 1998

Related U.S. Application Data

(62) Division of application No. 08/598,766, filed on Feb. 9, 1996, now Pat. No. 5,841,295.

(51) Int. Cl.$^7$ .................................................... G06F 17/50
(52) U.S. Cl. .................................. 716/17; 716/16; 716/7; 326/39
(58) Field of Search ................................... 364/488, 489, 364/490, 491; 395/500, 500.17, 500.18; 326/39, 40, 41; 716/16, 17

(56) References Cited

U.S. PATENT DOCUMENTS

| | | | |
|---|---|---|---|
| 4,032,894 | 6/1977 | Williams | 326/48 |
| 4,157,480 | 6/1979 | Edwards | 326/38 |
| 4,659,948 | 4/1987 | Sunter et al. | 326/38 |
| 4,870,302 | 9/1989 | Freeman | 326/41 |
| 4,959,564 | 9/1990 | Steele | 326/34 |
| 4,967,107 | 10/1990 | Kaplinsky | 326/38 |
| 5,432,719 | 7/1995 | Freeman et al. | 326/38 |
| 5,526,276 | * 6/1996 | Cox et al. | 716/17 |
| 5,572,437 | * 11/1996 | Rostoker et al. | 716/18 |
| 5,596,743 | * 1/1997 | Bhat et al. | 716/16 |
| 5,696,956 | * 12/1997 | Razdan et al. | 712/23 |
| 5,794,062 | * 8/1998 | Baxter | 712/30 |

(List continued on next page.)

FOREIGN PATENT DOCUMENTS

| | | |
|---|---|---|
| 0079127A1 | 6/1982 | (EP) . |
| 2305528 | 9/1997 | (GB) . |

OTHER PUBLICATIONS

Lo et al "Logarithmic Conversion by Four Partitioned Hybrid–ROMs," IEEE, pp. 550–552, 1996.*

(List continued on next page.)

*Primary Examiner*—Matthew Smith
*Assistant Examiner*—Vuthe Siek

(57) ABSTRACT

A programmable monolithic integrated logic circuit that includes look up table circuits and programmable logic array-like circuits. The integrated circuit can include a first number of the look up tables and a second number of the programmable logic array-like circuits and where the first and second numbers are related by a ratio of between 0.25:1 and 6:1, between 1:1 and 5:1, or about 4:1. The programmable logic array-like circuits can each include at least 10,000 or 50,000 equivalent two-input NAND gates, and the look up tables and the programmable logic array-like circuits can each comprise static random access cells. A method of implementing a logic circuit includes reading a netlist that includes a plurality of subnets. The method also includes determining the suitability of ones the subnets to being implemented with look up tables and with programmable logic array-like circuits, and determining whether to implement each subnet with a lookup table or a programmable logic array-like circuit based on results of the step of determining. Based on the steps of determining, the method implements a first subset of the plurality of subnets with look up table circuits and a second subset of the plurality of subnets with programmable logic array-like circuits.

31 Claims, 6 Drawing Sheets

U.S. PATENT DOCUMENTS

| | | | | |
|---|---|---|---|---|
| 5,796,623 | * | 8/1998 | Butts et al. | 703/23 |
| 5,819,064 | * | 10/1998 | Razdan et al. | 703/27 |
| 5,841,295 | * | 11/1998 | Kaviani | 326/39 |
| 5,841,663 | * | 11/1998 | Sharma et al. | 716/18 |
| 5,898,318 | * | 4/1999 | Pedersen | 326/39 |
| 5,926,036 | * | 7/1999 | Cliff et al. | 326/40 |

OTHER PUBLICATIONS

Froessl et al "Module Generation for and/XOR–Fields (XPLAs)," IEEE, pp. 26–29, 1991.*

Mathony et al, "Fast Efficient Algorithms for the Factoring," ISCA, pp. 1851–1854, 1988.*

Lu et al, "Tradeoff Literals Against Support for Logic Synthesis of LUT–Based FPGAs" IEEE, pp. 111–119, Mar. 1996.*

Cong et al "Flowmap: An Optimal Technology Mapping Algorithm for Delay Optimization in Lookup–Table Based FPGA Designs," IEEE, pp. 1–12, Jan. 1994.*

Suyama et al "LUT–Based FPGA Technology Mapping Using Permissible Functions," IEEE, pp. 215–218, Jan. 1996.*

Wilson, Ron "System–level programs debut", Special Issue (Dec. 15, 1995) Electrical Engineering Times pp. 20, 80 and 81.

Stansfield, Anthony and Page, Ian "The Design of New FPGA Architecture*" A paper published in Field Programmabl Logic 95, a workshop held in England in Aug. of 1995 (14 pages).

Hans–Jurgen Hergel, Valvo "Structure of Programmable Logic ICs" Design & Elektronic, edition Jan. 1988, pp. 119–121 (German reference and English translation thereof).

* cited by examiner

METHOD FOR IMPLEMENTING A PROGRAMMABLE LOGIC DEVICE HAVING LOOK-UP TABLE AND PRODUCT-TERM CIRCUITRY

RELATED APPLICATION

This application is a divisional of utility patent application No. 08/598,766, filed Feb. 9,1996, entitled HYBRID PROGRAMMABLE LOGIC DEVICE (as amended), now U.S. Pat. No. 5,841,295.

FIELD OF THE INVENTION

This invention relates to field programmable devices, and methods of implementing logic circuits with them. More specifically, the application pertains to field programmable integrated circuits that include both look up tables and programmable logic array-like circuits.

BACKGROUND OF THE INVENTION

Combinational logic functions are basic building blocks of digital electronic circuits. As is well known, any combinational function can be specified as a boolean logic function of its inputs, and this function can be implemented in a logic circuit. By expressing boolean logic functions in sum of products (SOP) or product of sums (POS) form, it becomes a straightforward task to implement them with two-stage logic circuits (e.g., AND-OR, NAND-NAND, or NOR-NOR circuits). These two-stage circuits can be classified as product-term or Pterm-based circuits and can be implemented directly by electrically connecting those logic gates that are required to produce a desired function.

Programmable logic arrays (PLAs) are integrated circuits that can include multiple general-purpose product-term cells, which a designer can configure to implement specific combinational logic circuits. PLAs can be mask-based arrays that are permanently configured during semiconductor processing to form application-specific integrated circuits (ASICs). Alternatively, they can be field-programmable, which means that they can be electrically programmed and reprogrammed with relative ease. Generally, designers configure PLAs by defining current paths within the cells to obtain a product-term circuit that performs a desired logic function (e.g., by closing electrically erasable links). PLAs often use so-called wired-OR or wired-AND configurations to implement their second stages, and larger PLA-based integrated circuits, known as complex programmable logic devices, can include numerous AND-OR PLA-based blocks that typically have partially fixed OR planes.

The denser field programmable integrated circuits have generally been field programmable gate arrays (FPGAs), which have employed look-up tables (LUTs) based on static random access memory programming (SRAM) technology instead of product-term architectures. In LUTs, the input states address an entry in a user-defined table that contains a stored output value that corresponds to those input states for a desired function. Designers can rewrite the data in the table to define different logic functions. Some research has indicated that four or five input LUTs in FPGAs result in the best results in terms of chip area. Using LUTs of different sizes in an integrated circuit has also been proposed.

One important use for FPGAs is in prototyping and ASIC emulation. In addition, FPGAs can also be acceptable substitutes for smaller ASICs. But because FPGAs can have a significant programming overhead, even high capacity field programmable devices tend to be significantly slower and less area-efficient than ASICs. This can limit their usefulness in a variety of situations, particularly where cost and/or speed are significant considerations.

SUMMARY OF THE INVENTION

In one general aspect, the invention features a programmable monolithic integrated logic circuit that includes look up table circuits and programmable logic array-like circuits. The plurality of look up tables can be arranged in blocks that each occupy substantially the same area as each of the programmable logic array-like circuits. The integrated circuit can include a first number of the look up tables and a second number of the programmable logic array-like circuits and where the first and second numbers are related by a ratio of between 0.25:1 and 6:1, between 1:1 and 5:1, or about 4:1. The programmable logic array-like circuits can each include at least 10,000 or 50,000 equivalent two-input NAND gates, and the look up tables and the programmable logic array-like circuits can each comprise static random access cells.

The programmable logic array-like circuits can each include a first stage of logic gates having input lines operatively connected to the input lines of the programmable logic circuit and output lines, a second stage of logic gates having input lines and output lines operatively connected to the output lines of the programmable logic circuit, and a crossbar switch having input lines operatively connected to the output lines of the first stage and output lines operatively connected to the input lines of the second stage. The programmable logic array-like circuits can each include a first logic stage having input lines operatively connected to the input lines of the programmable logic circuit and output lines, a second logic stage gates having input lines and output lines operatively connected to the output lines of the programmable logic circuit, and a crossbar switch having input lines operatively connected to the output lines of the first stage and output lines operatively connected to the input lines of the second stage, where the crossbar switch includes switchable, unconnectable, and fixed connections between its input and output lines. The programmable logic array-like circuits can each include a first logic stage having input lines operatively connected to the input lines of the programmable logic circuit and output lines, a second logic stage having input lines and output lines operatively connected to the output lines of the programmable logic circuit, and a crossbar switch having input lines operatively connected to the output lines of the first stage and output lines operatively connected to the input lines of the second stage, where the crossbar switch comprises a programmable inverter operatively connected in a circuit path between one of the input lines and one of the output lines.

In another general aspect, the invention features a programmable logic circuit that includes a programmable inverter having an input electrically coupled to an output of a first logic stage, and a second logic stage having an input programmably electrically coupled to an output line of the programmable inverter and to one of the output lines of the first logic stage.

In a further general aspect, the invention features a method of implementing a logic circuit that includes reading a netlist that includes a plurality of subnets. The method also includes determining the suitability of ones the subnets to being implemented with look up tables and with programmable logic array-like circuits, and determining whether to implement each subnet with a lookup table or a programmable logic array-like circuit based on results of the step of determining. Based on the steps of determining, the method implements a first subset of the plurality of subnets with look up table circuits and a second subset of the plurality of subnets with programmable logic array-like circuits.

The method can include merging single input pterms in the programmable logic array-like circuits into one multi-input pterm and separating the subnets into high fan-in subnets and low fan-in subnets. The step of implementing can implement some of the subnets as a combination of look up table circuits and programmable logic array-like circuits. The method can also include repeating the steps of reading, determining the suitability, determining whether to implement, and implementing for a second netlist that includes a certain subnet that is the same as a certain one of the subnets in the first netlist, where the repeated step of implementing implements the certain subnet of the first netlist in a look up table and implements the certain subnet of the second netlist in a programmable logic array-like circuit. Furthermore, the method can also include providing stimulus to the look up table circuits and to the programmable logic array-like circuits and monitoring the response of the look up table circuits and the programmable logic array-like circuits to the stimulus.

This invention is advantageous in that it can permit a large number of logic circuits to be implemented efficiently. And because functions that are not efficiently implemented in one architecture can be implemented using the other, circuitry can occupy less area, consume less power, and/or operate more quickly.

DETAILED DESCRIPTION

Figure 1:
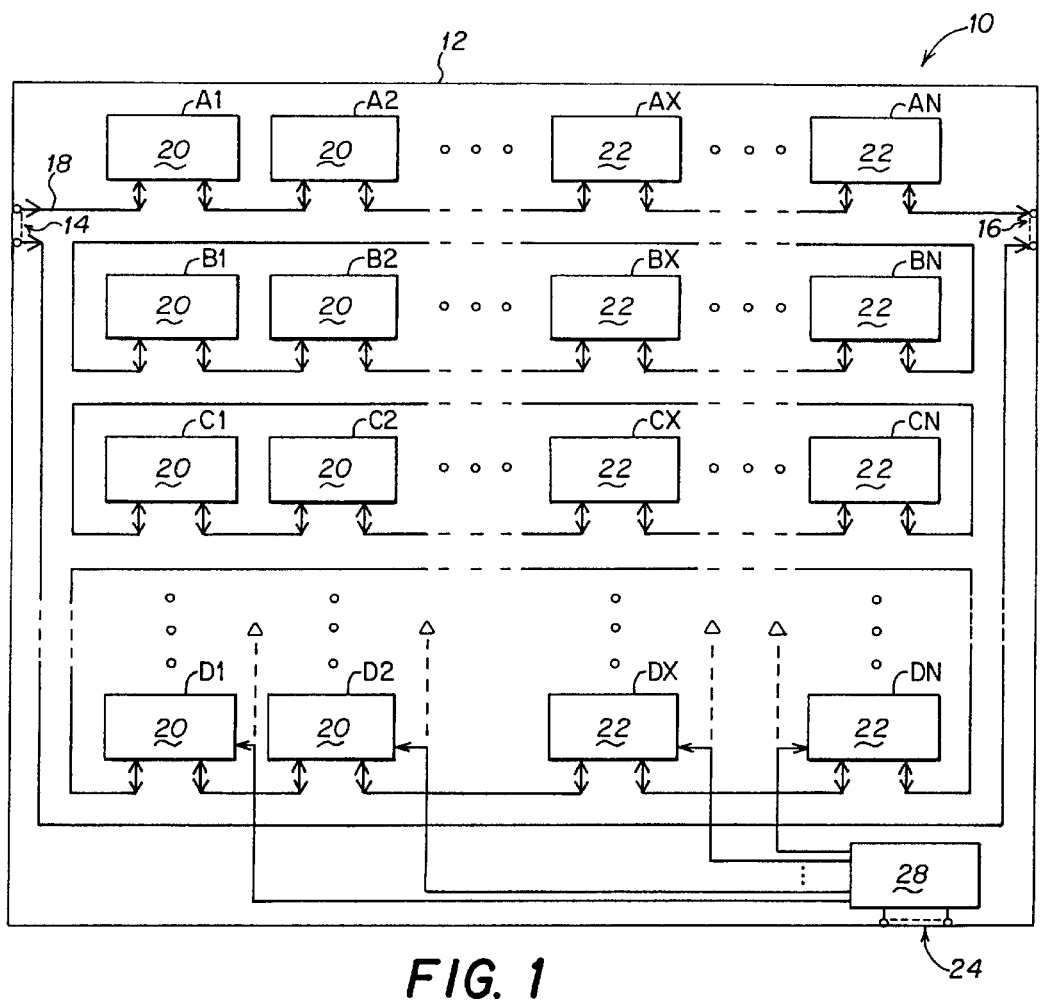
FIG. 1 is a simplified block diagram of an integrated circuit according to the invention.

Referring to FIG. 1, an illustrative integrated circuit 10 in accordance with one aspect of the invention includes an integrated circuit die 12 with a number of input leads or metallizations 14 and several of output leads or metallizations 16. A routing circuit 18 operatively connects the input and output leads to a plurality of programmable logic circuit blocks 20, 22. The routing circuit is a programmable distribution circuit that provides signals from the input leads to the logic circuit blocks. It can include programmable crossbar switches, multiplexers, or the like, as is known in the art, and will not be discussed further here, so as not to obfuscate the present invention.

The integrated circuit 10 can be a field programmable part that includes programming circuitry 28 operatively connected between programming leads 24 and the logic circuit blocks 20, 22, allowing a designer to program and reprogram the integrated circuit. In an alternative embodiment, the integrated circuit can be a mask-programmable gate array, which has no programming leads. It is further contemplated that at least some of the benefits of the invention would also be applicable to a set of integrated circuits used together, provided that the differing blocks can be distributed evenly (i.e., there are sufficient local interconnections between the blocks to implement the desired types of logic circuits). In one embodiment, the integrated circuit is manufactured using 0.35 micron CMOS integrated circuit fabrication techniques and includes on the order of 2,500 programmable logic blocks. Of course, the invention is also applicable to other densities and implementation technologies.

Figure 2:
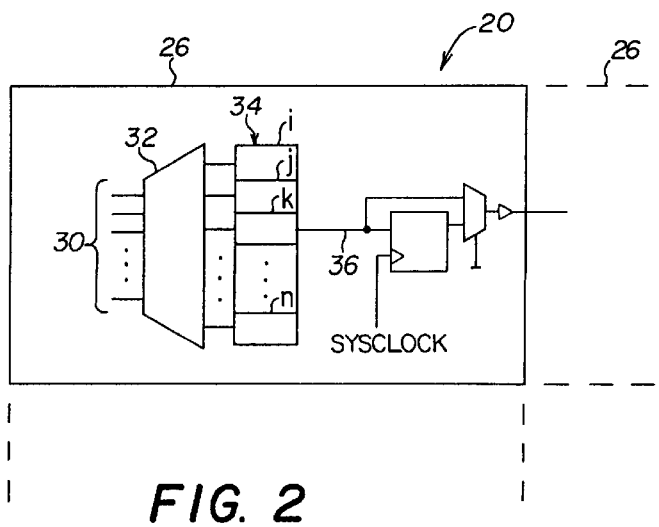
FIG. 2 is a simplified block diagram of a LUT circuit block for use in the integrated circuit of FIG. 1.

There are two types of logic blocks 20, 22 in the integrated circuit 10. The first type of block is a LUT block 20, and the second is a PLA-like block 22. Referring also to FIG. 2, each LUT block includes one or more LUT circuits 26. These LUT circuits each have input lines 30 that are operatively connected between the routing circuit 18 and input lines of an address decoder 32. The address decoder has output lines that are individually operatively connected to select lines of cells in a memory array 34. The memory array has an output line 36 that is operatively connected back to the routing circuit.

Figure 3:
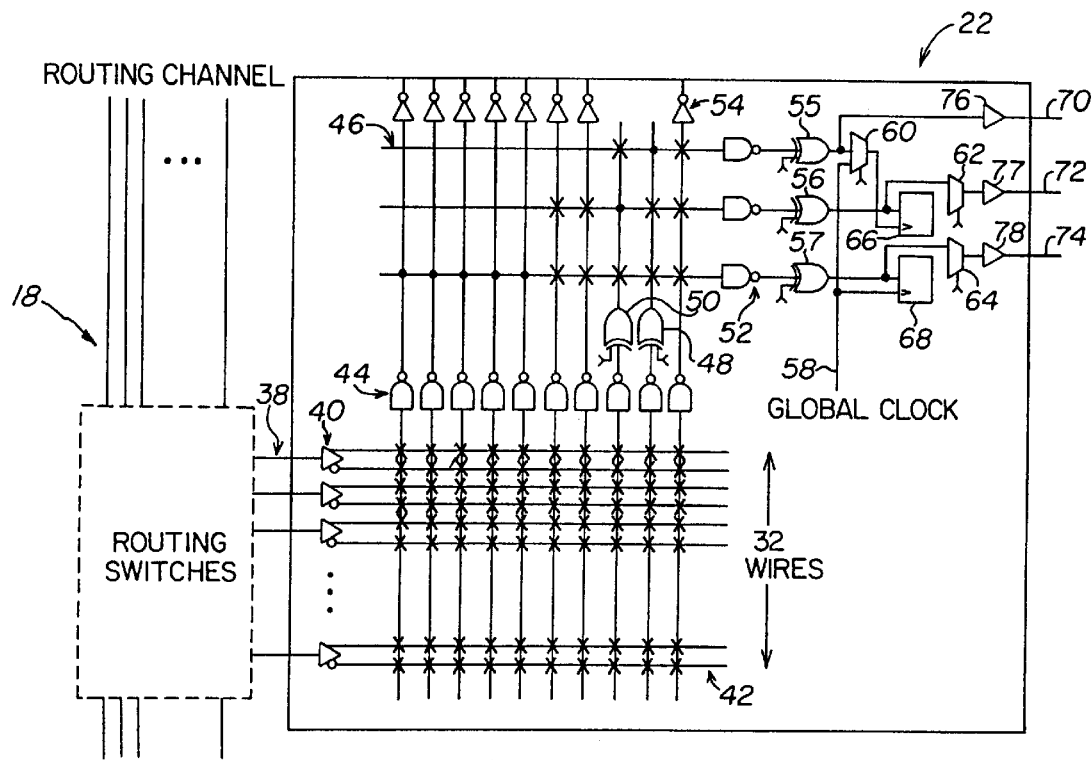
FIG. 3 is a schematic diagram of a PLA-like circuit block for use in the integrated circuit of FIG. 1.

Referring to FIG. 3, each PLA-like block 22 includes a series of input lines 38, which are each operatively connected between the routing circuit 18 and a respective input line of a series of buffers 40. Each of these buffers has an inverting output line and a non-inverting output line, and both of these output lines are provided to a programmable crossbar switch 42. The crossbar switch includes a series of programmable switches (indicated by crosses in FIG. 3). These switches can operatively connect each of the input lines of the crossbar switch to one or more of its output lines. The output lines of the crossbar switch 42 are each operatively connected to an input line of each of a first series of NAND gates 44.

Each of the NAND gates 44 has an output line that is operatively connected to an input line of a second crossbar switch 46, although two of the NAND gates are operatively connected to the crossbar switch via respective two-input exclusive-OR (XOR) gates 48, 50. Each of the XOR gates has a first input line responsive to one of the NAND gates and an output line operatively connected to one of the input lines of the second crossbar switch. A second input line of each of these XOR gates is operatively connected to the programming circuitry 28. In this configuration, the XOR gates act as programmable inverters configured by the programming leads 24. Once programmed, therefore, each of the output lines of the crossbar switch provides a product term for one or more logic functions (Pterm), which can be inverted if that output line is equipped with an XOR gate.

The second crossbar switch 46 is a specially-customized crossbar switch. Some of its input lines are switchably connectable to input lines of a second series of NAND gates 52 by pass transistors (represented by crosses in FIG. 3). Others of its inputs are permanently operatively connected to input lines of the second series of NAND gates 52 (indicated by dots on FIG. 3). And several of the input lines are not connectable to some of the input lines of some of the second stage NAND gates 52 (as represented by lines that simply cross on FIG. 3). The selection of the specific combination of programmable, always connected, and unconnected relationships in the second crossbar switch 46 is dependent upon statistics of the types of circuits likely to be implemented using the PLA-like block 22. Given its performance requirements, techniques for determining relationships for this type of crossbar switch are known in the art. The term PLA-like block is used to indicate that the block need not include a true, unconstrained PLA, but can also include a partially constrained Pterm-based circuit.

Each gate in the second series of NAND gates 52 has an output line that is operatively connected to a respective one of a series of second-stage two-input XOR gates 55, 56, 57, in a manner similar to the XOR gates 48, 50 at the output of the first series of NAND gates 44. These second-stage XOR gates act as programmable inverters configured by the programming leads 24.

A first of the second-stage XOR gates 55 has an output line that is operatively connected both to a first output line 70 of the PLA-like block 22 via a buffer 76, and to a first data input line of a first two-input multiplexer 60. The first two-input multiplexer also has a second data input line that is operatively connected to a global clock signal. The first multiplexer further has an output line that is operatively connected to a first input line of a first flip-flop 66. A second of the second-stage XOR gates 56 has an output line that is operatively connected to a second input line of the first flip-flop. This output line is also operatively connected to a first data input line of a second two-input multiplexer 62. This second multiplexer has a second input line operatively connected to an output line of the first flip-flop, and has an output line operatively connected to a second output line 72 of the PLA-like block via a buffer 77.

A third of the second-stage XOR gates 57 has an output line operatively connected to a first input line of a second flip-flop 68. The output line of this XOR gate is also operatively connected to an input line of a third two-input multiplexer 64. This third multiplexer also has a second input line operatively connected to an output line of the second flip-flop, and an output line operatively connected to a third output line 74 of the PLA-like block 22 via a buffer 78. The first multiplexer 60, the second multiplexer 62, and the third multiplexer 64 each has a separate select input line that is operatively connected to the programming circuitry 28.

The output lines of the first series of the NAND gates 44 are also provided to input lines of a series of inverting buffers 54, although those NAND gates which are operatively connected to the first-stage XOR gates 48, 50 are not operatively connected to inverting buffers in this series. The output lines of the inverting buffers and of the two XOR gates can be provided to further special-purpose crossbar switches in further PLA-like blocks. This architecture can accommodate Pterms that are too wide for a single PLA-like block.

In one embodiment, each LUT block 20 includes four four-bit LUTs, and the area of the integrated circuit 10 is divided roughly evenly between LUT blocks and PLA-like blocks 22 of equal size and shape (i.e., there are four times as many LUTs as PLA-like blocks). Other ratios are possible, and it is contemplated that ratios between 0.25:1 and 6:1 will be particularly well suited to most applications, and that many circuits could be implemented using a ratio of between 1:1 and 1:5.

The second-stage NAND gates 55, 56, 57 in the PLA-like blocks can be actual logic gates, instead of wired gates. Although this may reduce the density of the integrated circuit, it may also reduce its overall static power consumption. As a result, the ultimate capacity achieved with this architecture may be higher in practice than if wired gate topology were to be used, because limits on static power dissipation will not be exceeded.

Other approaches can be used to reduce static power consumption and thereby achieve optimum density. One of these, which has been termed "domino logic," bears some similarity to wired-or logic, but relies on precharging a node instead of having a device pull the node up or down, and this approach therefore consumes less static power.

The integrated circuit 10 according to this embodiment is built entirely with SRAM technology. Each LUT block 20 includes a bank of SRAM cells to store logic function state information, and each PLA-like block 22 employs SRAM cells to hold control signals for its pass transistors. It is also possible to use electrically erasable links either alone or in connection with SRAM cells to make a non-volatile version of the integrated circuit.

The PLA-like blocks in this embodiment have 16 inputs, provide for ten Pterms and three outputs, as illustrated generally in FIG. 3. Outputs of the inverting buffers 54 in a subset of the PLA-like blocks are provided to three other PLA-like blocks. This particular PLA-like block architecture was based on an analysis of 190 of the 1993 Microcircuits Institute of North Carolina (MCNC) logic synthesis benchmarks with consideration to the area it required to implement them. Of course, variations of this architecture are possible, and some architectures may be more suited to implementing different types of circuits. It may also be possible to develop an architecture that employs different sizes of LUT and/or PLA-like blocks in the same integrated circuit. Furthermore, it may be desirable to develop a family of integrated circuits that provides different architectures and/or mixtures of LUT and PLA-like blocks. Of course, the LUT and PLA-like blocks can also be combined on a single integrated circuit with other digital or analog circuitry.

Figure 5:
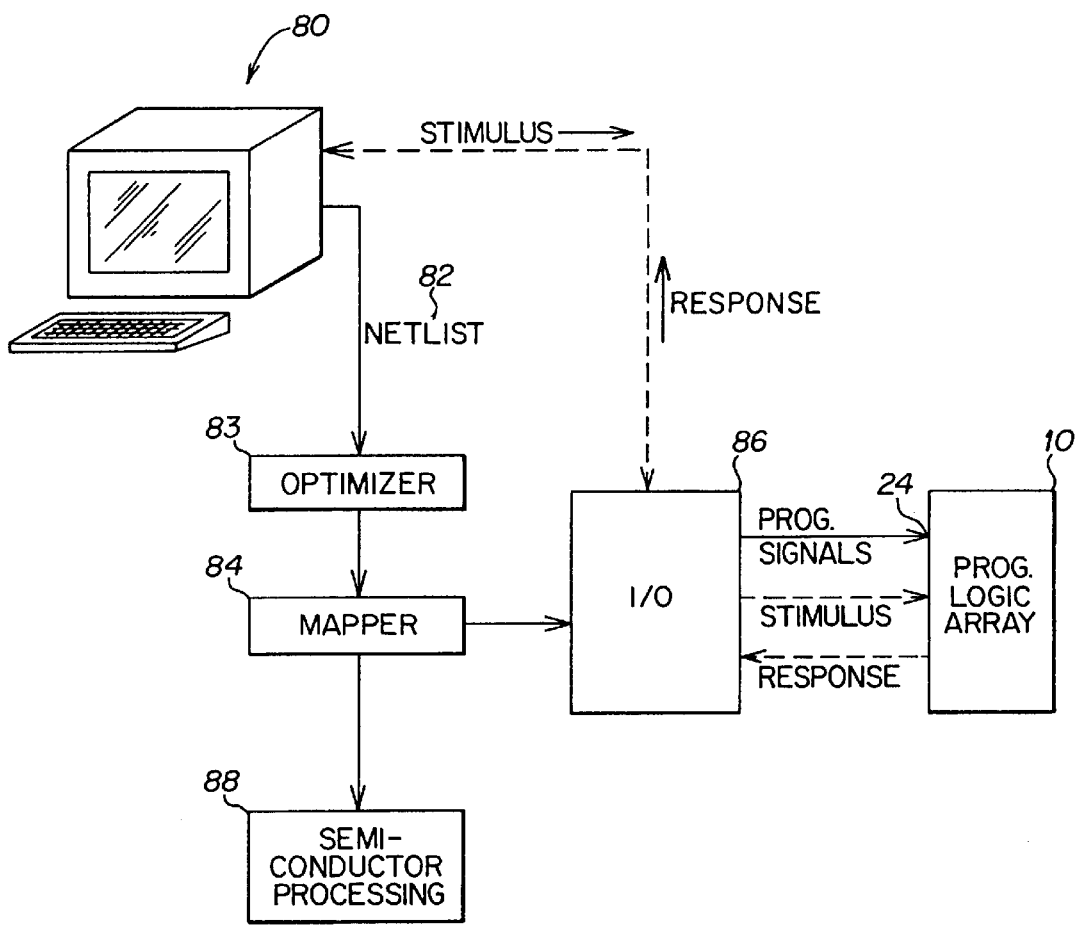
FIG. 5 is a block diagram illustrating a system that can be used to implement a complex logic circuit in an integrated circuit such as the one shown in FIG. 1.

In operation, referring to FIG. 5, a designer first specifies desired parameters for a logic circuit, using for example, a computer-aided design (CAD) workstation 80. Once the designer is satisfied with the specification of the circuit, he provides it in the form of a netlist 82 to a mapper 84 via an optimizer 83. In particular embodiments, the netlist can be expressed in Verilog or EDIF formats, although other formats could be used instead.

The optimizer 83 and the mapper 84 can be implemented with a special purpose circuit, or with a programmed general-purpose computer, and they can advantageously be designed to run on the CAD workstation 80. The mapper provides as its output a list of programming data that indicates how the integrated circuit 10 needs to be programmed in order to implement the netlist circuitry. It is contemplated that the programming information will be used to program one or more field programmable integrated circuits such as the one shown in FIG. 1, although it is also possible to use the programming information in semiconductor processing operations to obtain permanently configured mask-based versions of the netlist circuitry.

Input/output circuitry 86 receives the programming information from the mapper and transforms it into programming signals, which it then provides to the programming leads 24 of the integrated circuit IO. The input-output circuitry may simply operate to program the logic array, or it can be part of an ASIC development system, which can also provide simulated operating signals (stimulus) to the integrated circuit and detect outputs resulting from this stimulus (response). In such systems, the stimulus can be provided from the workstation 80, and the resulting response can be returned, where it can be displayed to the user, or further processed.

Figure 6:
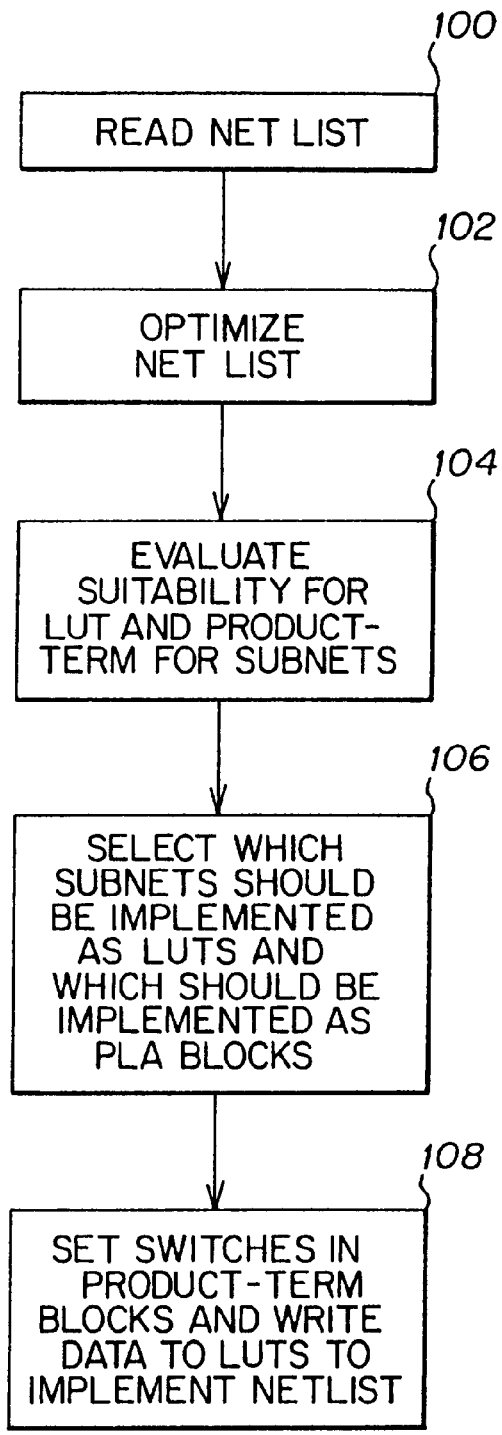
FIG. 6 is a flowchart illustrating optimizing, mapping, and I/O operations for the system of FIG. 5.

Referring to FIG. 6, after reading in the netlist (step 100), the optimizer 83 performs a technology independent optimization on the netlist (step 102). This optimization includes several operations that optimize the netlist without changing its function. This optimization can be performed by one run of a standard technology independent optimization entitled script.rugged, which has been provided along with SIS (Sequential Interactive Synthesis) and uses various known methods of optimizing combinational circuits.

After optimization, the mapper 84 evaluates the subnets (or nodes) in the netlist to determine their suitability for implementation with lookup table blocks and their suitability for implementation with PLA-like blocks (step 104). The mapper then selects which subnets should be implemented in lookup table blocks and which subnets should be implemented as PLA-like blocks (step 106). This selection is performed with regard to minimizing the area occupied by the implemented netlist, the speed at which the implemented netlist will operate, or both. Generally, subnets that have fewer or equal numbers of inputs as do the LUT blocks are implemented in LUT blocks, and smaller subnets may even share LUT blocks. Subnets with larger numbers of inputs are typically implemented in PLA-like blocks, especially if they do not require a large number of Pterms. Subnets having large numbers of inputs and large numbers of Pterms can be implemented with more than one LUT block or PLA-like block or a combination of both.

In one embodiment that strives to minimize the amount of integrated circuit area occupied by the netlist, the mapper 84 first breaks the results of technology independent optimization into high fan-in nodes and low fan-in nodes. High fan-in nodes are those that have more inputs than the LUT blocks (e.g., four), while low fan-in nodes have this number of inputs or less. During this process, the mapper partitions High fan-in nodes that have too many inputs to fit in a single PLA-like block (e.g., 16) into two or more blocks. The mapper then stores high fan-in nodes and low fan-in nodes in repetitive ones of a pair of sorted linked lists. The linked lists order the nodes according to the product of the number of Pterms by the number of inputs for each node.

Once the linked lists are complete, the mapper allocates the nodes that have the highest product values in the high fan-in list to PLA-like blocks, and prepares lists of switch states for these blocks. The mapper processes the lists in order from highest to lowest product values, and in so doing, it attempts to pack more than one of the high fan-in nodes into individual PLA-like blocks if possible. If the mapper runs out of PLA-like blocks before the high fan-in list is exhausted, it begins implementing the nodes in LUT blocks. Although one might expect that this process would always result in poor space efficiency, in practice it generally tends not to, as the nodes at the end of the list often do not need a large number of LUT blocks. For example, single Pterm nodes decompose easily, and using Shannon's theorem allows nodes that have one more input than do the LUT blocks (e.g., five) to fit 2.5 LUT blocks.

After the mapper 84 has processed all of the high fan-in nodes, it begins to prepare LUT values for the low fan-in nodes. As with the high fan-in nodes, the mapper can attempt to pack more than one low fan-in node into a LUT block 20. In addition, the mapper can merge some nodes with others to make compound nodes that are more efficiently implemented.

One of skill in the art would be able to make a variety of modifications to the mapping procedure. For example, it may be desirable to optimize the mapping procedure to yield a circuit that operates quickly, but may not always provide the most efficient implementation. Furthermore, in applications such as ASIC verification, it may be quite important for the mapper to process nodes quickly, even if the resulting node implementations are less than optimal.

An analysis of the node sizes in benchmark circuits indicates that most larger circuits include three categories of subnets. The first category is best suited to implementation with LUTs, a second category is best suited to implementation with PLA or PLA-like circuits, and a third category is relatively well suited to implementation with either type of block. Studies of the statistics of a variety of benchmarks tends to show that most logic circuits that have a gate density of over 10,000 four-transistor NAND gate equivalents exhibit this breakdown, and this effect appears to be even more pronounced at densities of 25,000 or 50,000 or more. For this reason, it is possible to implement a variety of different circuits of these sizes using an integrated circuit with a fixed ratio of LUT blocks to PLA-like blocks.

Figure 7:
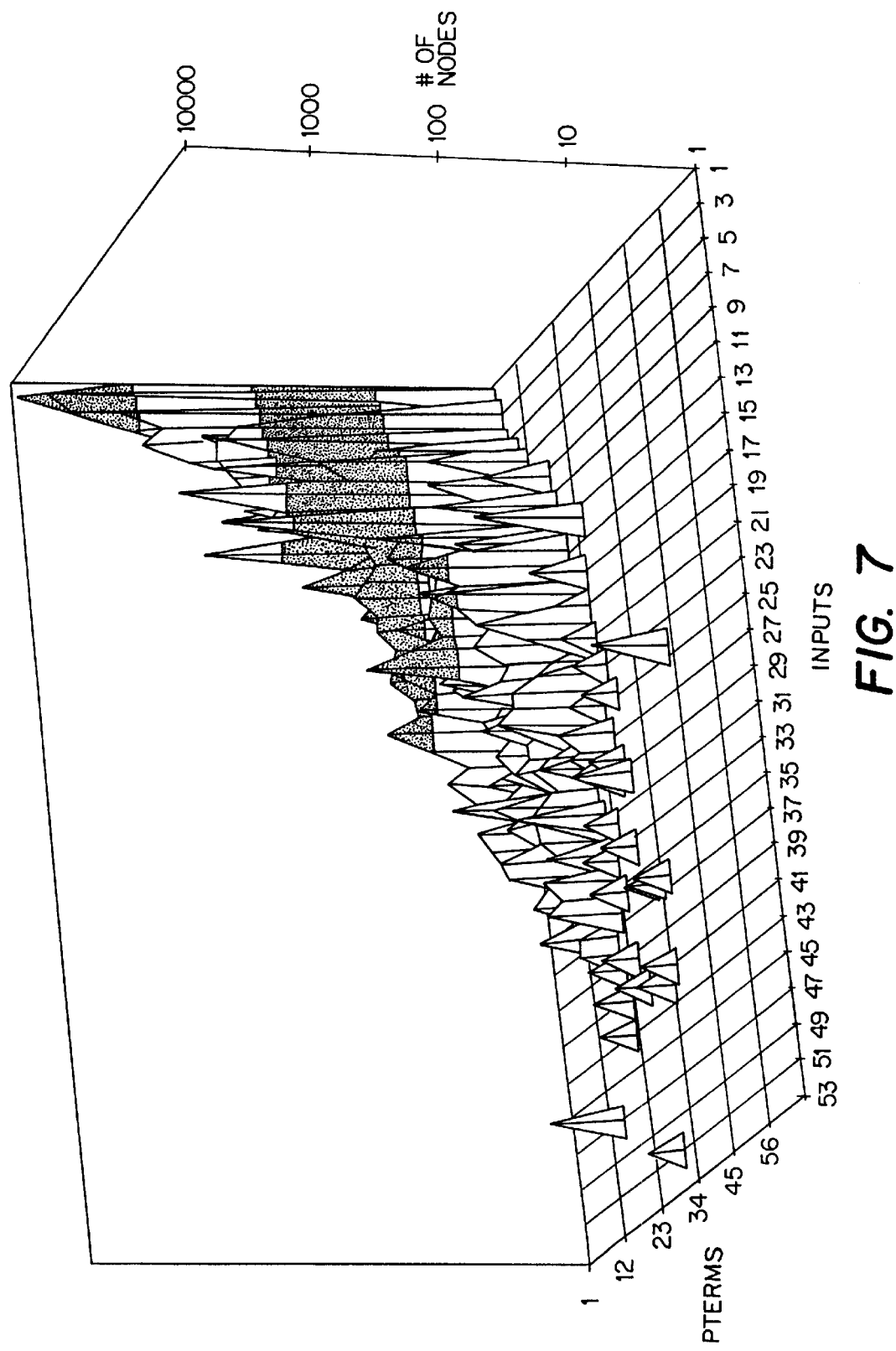
FIG. 7 is a node size distribution plot for all combinational nodes in 190 MCNC benchmarks after technology independent optimization, with a first axis being the number of Pterms, a second axis being the number of inputs, and a third axis being the number of nodes.

The statistical analysis used in developing the hybrid architecture presented above may be understood in more detail from the following discussion. Any digital circuit can be represented as a Directed Acyclic Graph (DAG) that consists of combinational and sequential nodes. Each combinational node of the circuit then can be represented in SOP form. As the first step toward defining the hybrid architecture, it is useful to examine the combinational nodes present in real circuit, and produce a distribution of nodes with respect to size. The size of a node is defined according to two parameters: 1) the number of inputs to the node, and 2) the number of Pterms in the sum of products representation of that node. The circuits used in one instance are from one 1993 MCNC logic synthesis benchmark suite, but, of course, others could be used instead. FIG. 7 shows the distribution of node sizes for all combinational nodes in 190 MCNC benchmarks after technology independent optimization. In total, the benchmarks comprise 36304 combinational nodes. As shown in FIG. 7 it is apparent that the majority of nodes are small. A closer examination reveals that more than 70% are 4-bounded and roughly 20% of the nodes have fanin equal or greater than six; these latter nodes will be referred to as high fanin nodes.

The goal is to implement the nodes in FIG. 7 in two types of logic resources: PLA-based cells, and LUTs. For a LUT with K inputs, the area of the cell is proportional to $2^K$. For a PLA-based cell, the cell area is approximately proportional to $K^2$. Note that for K=4, $2^K=K^2$, but for K<4 LUTs should be more efficient than PLA-based cells. Therefore 4-bounded nodes can be efficiently implemented using LUTs. This accounts for the majority of the nodes in circuits, but there is still a significant number of nodes with high fanin. These nodes could also be implemented using 4-LUTs, but the area required would be large. From FIG. 7, we can observe that most high fanin nodes do not require a large number of Pterms. This implies that these nodes are well suited for implementation in PLA-based cells.

Figure 8:
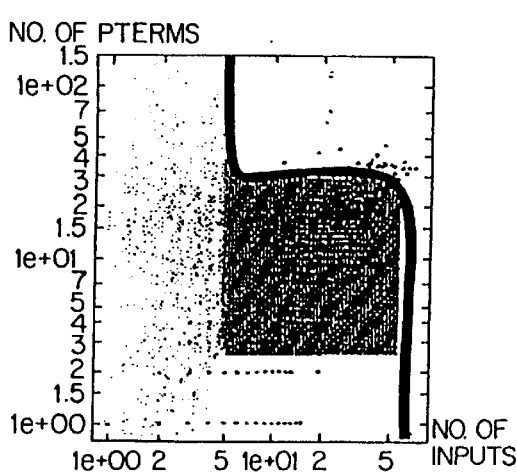
FIG. 8 is a logic plane diagram for the same nodes presented in FIG. 7, plotting the number of Pterms versus the number of inputs for those nodes.

The concept of suitability of nodes of different sizes in either LUTs or PLAs is illustrated in FIG. 8, which shows the distribution of all combinational nodes in the logic plane. Each dot in the figure represents combinational nodes of a specific size, but the number of nodes of each size is not shown. In FIG. 8, the nodes that lie in the lightly shaded rectangle efficiently fit into 4-LUTs. Similarly, PLAs are more attractive for implementing the nodes that lie in the heavily shaded box. Nodes that do not lie in either of these areas could be implemented using either LUTs or PLAs, but the cost is expected to be relatively high. If both PLAs and LUTs are available in an FPGA architecture, a boot-like area of the logic plane is naturally supported, as indicated by the bold curve in FIG. 8. By covering a wider area of the logic plane, the overall cost of the implementation of most of the circuits decreases.

Figure 9:
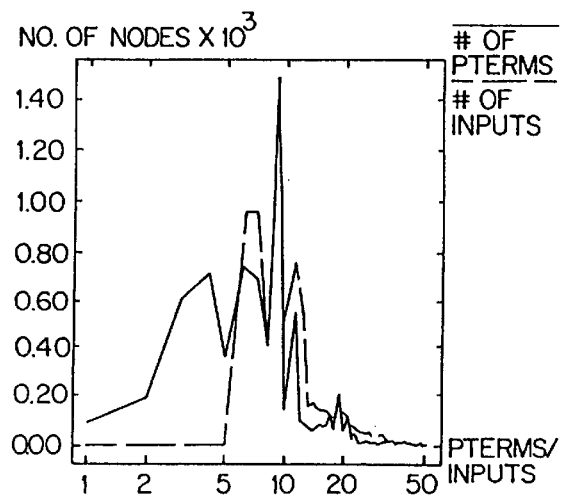
FIG. 9 is a node size distribution plot illustrating the number of nodes against the number of Pterms and the number of inputs for the nodes presented in FIG. 7, excluding 5-bounded nodes.
Figure 10:
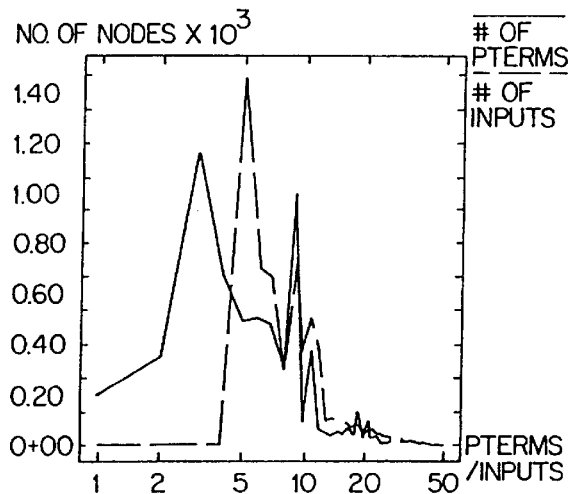
FIG. 10 is a node size distribution plot illustrating the number of nodes against the number of Pterms and the number of inputs for the nodes presented in FIG. 7, excluding 4-bounded nodes.

Since 4-bounded nodes will be implemented in 4-LUT blocks, the PLA-like blocks should be designed in such a way that they are well-matched for implementation of nodes with more than four inputs. Also, it has been observed that many 5-input nodes are simple ORs or ANDS; these nodes can easily be decomposed and realized in 4-LUTs. It is not desirable that the nodes that are to be implemented in LUTs affect the PLA-like block architecture. FIG. 9 shows the node size distribution, in terms of number of Pterms and number of inputs, for all MCNC Benchmarks, excluding 5-bounded nodes. With reference to the figure, there is a peak at nine Pterms, with some larger nodes and many smaller ones. To observe the effects of 5-input nodes, FIG. 10 shows the same information, except that only 4-bounded nodes are excluded. Now, there is a new peak at 3 Pterms; it appears that the number of 5-input nodes is significant and may strongly affect the analysis. Because the effects of 5-input nodes is pronounced and since many of these nodes are suitable for LUTs, it is possible to exclude them when designing the PLA-like architecture. Similar statements can also be made for nodes with higher fanin, but the effects would be less important because there tend to be fewer of these high fanin nodes. It is also possible to exclude only obviously decomposable 5-input and high fanin nodes (which are nodes with only one Pterm). A summary of statistics of node sizes excluding nodes with various numbers of inputs is presented in Table 1.

There are three statistical parameters that affect the PLA-like blocks: 1) the average number of inputs, 2) the average number of Pterms and 3) the ratio of the number of inputs to the number of Pterms for each combinational node. Table 1 gives the mean and variance, $(\mu, \sigma)$, of these parameters. Each row of the table corresponds to a specific value of K and shows the statistical data excluding K-bounded nodes. Also, under the columns denoted "filtered" additional nodes are excluded, according to the following assumptions: first, all single-input Pterms in a node are merged into one multi-term Pterm. This is based on an observation that in the SOP form of high fanin nodes there are many Pterms with only one input. These single-input Pterms can be merged into one, with almost no extra cost for the PLA-like architecture. The second assumption is that nodes that are single Pterms (i.e. ANDs, ORs) are excluded. There are many combinational nodes with only one Pterm. Since these nodes are decomposable, LUTs are as good as a PLA-like block for their implementation, so they should be excluded from the data that affect the PLA-like architecture.

Table 1 serves as a guide for designing the PLA-like block architecture. In using 4-LUTs it is reasonable to base the PLA-like block on the K=4 row of the table, but for reasons discussed earlier, it is more appropriate to use the filtered columns. Thus the PLA-like block should be designed to suit the parameters shown in the shaded boxes. It was decided that 5 for the number of Pterms and 1.6 for the ratio of the number of inputs to the number of Pterms are the closest practical values to the averages shown in the shaded cells.

Figure 4A:
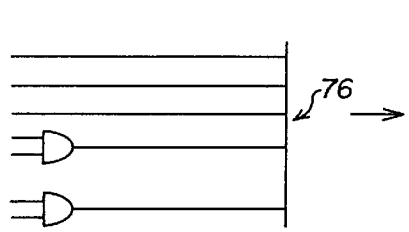
FIGS. 4A, 4B, and 4C show a transformation from a first logic circuit to an equivalent second logic circuit, to illustrate the operation of the additional inversion level of the circuit of FIG. 3.
Figure 4B:
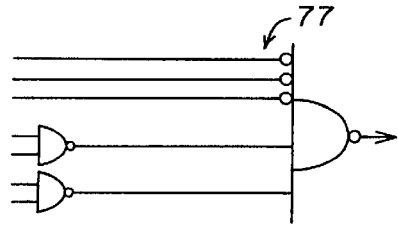
Figure 4C:
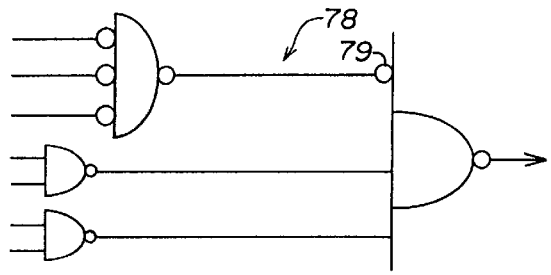

Referring now to FIGS. 3–5, the XOR gates 48, 50 at the output of the first stage permit the integrated circuit 10 to implement logic circuitry more densely. In particular, the AND-OR form 76 shown in FIG. 4A is equivalent to the NAND-NAND form 77 shown in FIG. 4B, and these are both equivalent to the modified form 78 shown in FIG. 4C. The modified form reduces the number of Pterms from 5 to 3, by providing an extra inversion 79. The use of this merging operation was found to decrease the number of Pterms in the 190 observed MCNC benchmarks by approximately 25 per cent on average. Providing the first stage XOR gates 48, 50 in the PLA-like blocks 22 can therefore reduce the logic resources necessary to implement circuits, leading to better area efficiency.

Figure 11:
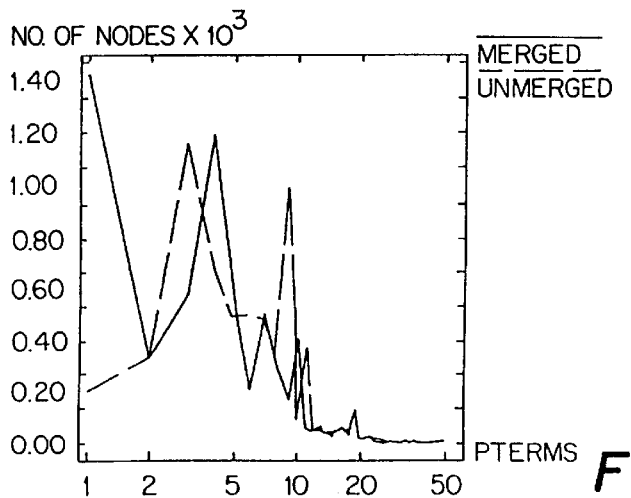
FIG. 11 is a graph illustrating the distribution of the number of nodes against the number of Pterms, excluding 4-bounded nodes for merged and unmerged single-input Pterms.

This feature of the PLA-like block is motivated by the filtered columns in Table 1, and its effects on the distribution of node sizes is shown in FIG. 11, which provides the distribution of the number of Pterms after merging. The Pterm distribution in FIG. 10 is repeated in FIG. 11 to facilitate a comparison between the two.

The present invention has now been described in connection with a number of specific embodiments thereof. However, numerous modifications which are contemplated as falling within the scope of the present invention should now be apparent to those skilled in the art. Therefore, it is

| Excluding K-bounded nodes | Inputs $(\mu, \sigma)$ | Pterms $(\mu, \sigma)$ | Inputs/Pterms $(\mu, \sigma)$ | Pterms (filtered) $(\mu, \sigma)$ | Inputs/Pterms (filtered) $(\mu, \sigma)$ |
|---|---|---|---|---|---|
| K = 6 | (12.5, 6.56) | (9.32, 7.29) | (1.55, 1.02) | (6.64, 7.48) | (1.81, 1.32) |
| K = 5 | (11.57, 6.48) | (8.47, 7.08) | (1.61, 1.01) | (6.25, 7) | (1.77, 1.21) |
| K = 4 | (10.04, 6.32) | (7.23, 6.62) | (1.68, 1.03) | (5.53, 6.3) | (1.7, 1.07) |
| K = 3 | (8.59, 6.09) | (6.02, 6.17) | (1.78, 1.01) | (4.89, 5.62) | (1.62, 0.94) |
| K = 2 | (6.35, 5.45) | (4.36, 5.21) | (1.83, 0.94) | (3.77, 4.58) | (1.5, 0.76) |
| K = 1 | (4.54, 4.69) | (3.12, 4.26) | (1.74, 0.79) | (2.96, 3.65) | (1.29, 0.66) |
| K = 0 | (4.46, 4.66) | (3.07, 4.22) | (1.72, 0.79) | (2.91, 3.62) | (1.29, 0.66) |

What is claimed is:

1. A method of implementing a logic circuit, comprising:

(1) receiving a first netlist defining circuit components and connections between said circuit components, said first netlist including a plurality of subnets;

(2) determining whether each of said plurality of subnets is to be implemented with a look-up table circuit or a product-term circuit;

(3) implementing, based on said step (2), each of a first subset of said plurality of subnets in a look-up table circuit and each of a second subset of said plurality of subnets in a product-term circuit;

(4) separating said plurality of subnets into high fan-in subnets and low fan-in subnets, wherein said high fan-in subnets have a number of inputs that is greater than a first predetermined number of inputs, and wherein said low-fan-in subnets have a number of inputs that is equal to or less than said predetermined number of inputs; and (5) implementing each said high fan-in subnets in a product-term circuit, and each said low fan-in subnets in a look-up table circuit.

2. The method of claim 1, further comprising the step of:

(6) prior to said step (2), performing a technology independent optimization on said first netlist.

3. The method of claim 1, further comprising the step of:

(6) merging single input product-terms in the product-term circuits into one multi-input product-term circuit.

4. The method of claim 1, wherein said logic circuit includes at least 10,000 equivalent two-input NAND gates.

5. The method of claim 1, wherein said logic circuit includes at least 50,000 equivalent two-input NAND gates.

6. The method of claim 1, wherein said step (3) implements one or more of said plurality of subnets as a combination of a look-up table circuit and a product-term circuit.

7. The method of claim 1, further comprising the steps of:

(6) providing stimulus to said look-up table circuits and to said product-term circuits; and (7) monitoring responses of said look-up table circuits and said product-term circuits to said stimulus.

8. The method of claim 1, wherein said determining step is performed so as to achieve one of either minimizing the area occupied by the implemented netlist and the speed at which the implemented netlist will operate.

9. The method of claim 1, further comprising the steps of:

(6) separating said high fan-in subnets into a first group having a number of inputs that is less than a second predetermined number and a second group of high fan-in subnets having a number of inputs that is greater than said second predetermined number, (7) implementing said first group of subnets in a single product-term circuit and said second group of subnets in more than one product-term circuit.

10. The method of claim 9, wherein said first predetermined number of inputs is 4.

11. The method of claim 10, wherein said second predetermined number of inputs is 16.

12. The method of claim 1, wherein said determining step is performed to achieve at least one of minimizing the area occupied by the implemented netlist and the speed at which the implemented netlist will operate.

13. The method of claim 1, wherein said step (3) comprises the steps of:

(a) multiplying a number of product terms and the number of inputs for each said subnet to generate a product value; and (b) implementing said subnets in sequence beginning with subnets having a greatest product values and progressing to subnets having a least product value.

14. The method of claim 1, wherein said first predetermined number of inputs is 4.

15. A method of implementing a logic circuit, comprising:

(1) receiving a first netlist defining circuit components and connections between said circuit components, said first netlist including a plurality of subnets;

(2) determining whether each of said plurality of subnets is to be implemented with a look-up table circuit or a product-term circuit; (3) implementing, based on said step (2), each of a first subset of said plurality of subnets in a look-up table circuit and each of a second subset of said plurality of subnets in a product-term circuit;

(4) separating said plurality of subnets into high fan-in subnets and low fan-in subnets, wherein said high fan-in subnets have a number of inputs that is greater than a first predetermined number of inputs, and wherein said low-fan-in subnets have a number of inputs that is equal to or less than said predetermined number of inputs; and (5) implementing each said high fan-in subnets in a product-term circuit, and each said low fan-in subnets in a look-up table circuit.

16. The method of claim 15, further comprising the step of:

(6) merging single input product-terms in the product-term circuits into one multi-input product-term circuit.

17. The method of claim 16, further comprising the steps of:

(7) providing stimulus to said look-up table circuits and to said product-term circuits; and (8) monitoring responses of said look-up table circuits and said product-term circuits to said stimulus.

18. A method of implementing a logic circuit, comprising:

(1) receiving a first netlist defining circuit components and connections between said circuit components, said first netlist including a plurality of subnets;

(2) determining whether each of said plurality of subnets is to be implemented with a look-up table circuit or a product-term circuit;

(3) implementing, based on said step (2), each of a first subset of said plurality of subnets in a look-up table circuit and each of a second subset of said plurality of subnets in a product-term circuit, wherein said step (3) includes the steps of:

(a) multiplying a number of product terms and the number of inputs for each said subnet to generate a product value; and (b) implementing said subnets in sequence beginning with subnets having a greatest product values and progressing to subnets having a least product value.

19. The method of claim 18, further comprising the step of:

(4) prior to said step (2), performing a technology independent optimization on said first netlist.

20. The method of claim 18, further comprising the step of:

(4) merging single input product-terms in the product-term circuits into one multi-input product-term circuit.

21. The method of claim 18, further comprising the step of:

(4) separating said plurality of subnets into high fan-in subnets and low fan-in subnets, wherein said high fan-in subnets have a number of inputs that is greater than a first predetermined number of inputs, and wherein said low-fan-in subnets have a number of inputs that is equal to or less than said predetermined number of inputs (5) implementing each said high fan-in subnets in a product-term circuit, and each said/low fan-in subnets in a look-up table circuit.

22. The method of claim 21, further comprising the step of:

(6) separating said high fan-in subnets into a first group having a number of inputs that is less than a second predetermined number and a second group of high fan-in subnets having a number of inputs that is greater than said second predetermined number, (7) implementing said first group of subnets in a single product-term circuit and said second group of subnets in more than one product-term circuit.

23. The method of claim 18, wherein said determining step is performed to achieve at least one of minimizing the area occupied by the implemented netlist and the speed at which the implemented netlist will operate.

24. The method of claim 18, wherein said logic circuit includes at least 10,000 equivalent two-input NAND gates.

25. The method of claim 18, wherein said logic circuit includes at least 50,000 equivalent two-input NAND gates.

26. The method of claim 18, wherein said step (3) implements one or more of said plurality of subnets as a combination of a look-up table circuit and a product-term circuit.

27. The method of claim 18, further comprising the steps of:

(4) providing stimulus to said look-up table circuits and to said product-term circuits; and (5) monitoring responses of said look-up table circuits and said product-term circuits to said stimulus.

28. The method of claim 18, wherein said determining step is performed with regard to one of either minimizing the area occupied by the implemented netlist and the speed at which the implemented netlist will operator.

29. The method of claim 28, wherein said first predetermined number of inputs is 4.

30. The method of claim 29, wherein said second predetermined number of inputs is 16.

31. The method of claim 21, wherein said first predetermined number of inputs is 4.

* * * * *